United States Patent [19]

Garber

[11] Patent Number: 4,600,852
[45] Date of Patent: Jul. 15, 1986

[54] WIDE BANDWIDTH WITHDRAWAL WEIGHTED SURFACE ACOUSTIC WAVE FILTERS

[75] Inventor: Edward M. Garber, Brookline, Mass.

[73] Assignee: Massachusetts Institute of Technology, Cambridge, Mass.

[21] Appl. No.: 666,431

[22] Filed: Oct. 30, 1984

[51] Int. Cl.[4] ............................................. H01L 41/08
[52] U.S. Cl. ............................. 310/313 B; 310/313 C
[58] Field of Search ........... 310/313 R, 313 B, 313 C, 310/313 D; 333/150-155, 193-196

[56] References Cited

U.S. PATENT DOCUMENTS

| | | | |
|---|---|---|---|
| 3,748,603 | 7/1973 | Wojcik | 310/313 B |
| 4,200,849 | 4/1980 | Malocha | 333/196 X |
| 4,516,093 | 5/1985 | Nyffeler | 333/193 |

FOREIGN PATENT DOCUMENTS

| | | | |
|---|---|---|---|
| 0116813 | 7/1983 | Japan | 333/194 |
| 2117593 | 10/1983 | United Kingdom | 310/313 B |

OTHER PUBLICATIONS

"Synthesis of High Performance SAW Filters with Nonuniformly Spaced Fingers" by E. M. Garber et al., Proceedings of the Ultrasonics Symposium, pp. 27-32 (1983).
"Impulse Model Design of Acoustic Surface-Wave Filters" by C. S. Hartmann et al., IEEE Transactions on Sonics and Ultrasonics, V.SU-20, No. 2, pp. 80-93 (1973).
"Universal Method for Compensation of SAW Diffraction and Other Second Order Effects" by W. R. Mader et al., IEEE Ultrasonics Symposium, pp. 23-28 (1982).
"Transverse Electrostatic End Effects in Interdigital Transducers" R. S. Wagers, IEEE Cat. #76 Ultrasonics Symposium, pp. 536-539 (1976).
"Weighting Interdigital Surface Wave Transducers by Selective Withdrawal of Electrodes" by C. S. Hartmann, IEEE Cat. #73 Ultrasonics Symposium, pp. 423-426, (1973).

Primary Examiner—Mark O. Budd
Attorney, Agent, or Firm—Kenway & Jenney

[57] ABSTRACT

A surface acoustic wave (SAW) filter consists of two acoustically coupled transducers built on the same piezoelectric film or substrate. The transducers are constructed by depositing a conducting comb structure having interdigitated fingers on the substrate. Spacer elements are placed between gaps of the same polarity within the comb structure. The addition of the spacer elements permit non-zero gap weights of the same sign to follow one another, in contrast to the standard structure which forces these sources to alternate in sign. This added flexibility results in new withdrawal weighted structures that significantly increase the bandwidth over which the rejection band performance is good and also reduces passband ripple. The increase in the accuracy of the withdrawal weighting permissible with these new structures improves filter performance.

10 Claims, 7 Drawing Figures

3 WEIGHTS ALLOWED: 1, 0, -1
GAPS OF THE SAME POLARITY MUST BE SEPARATED BY AT LEAST $\lambda_0$ STRUCTURE IIa – A NEW WITHDRAWAL WEIGHTED STRUCTURE

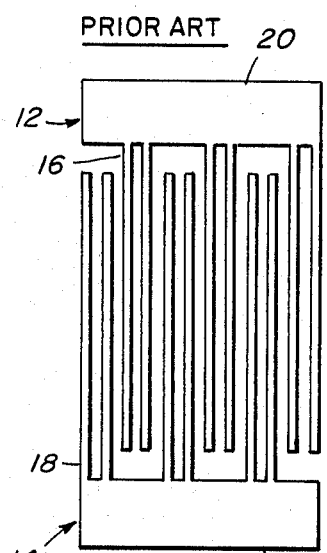
FIG. 1
THE INTERDIGITAL TRANSDUCER
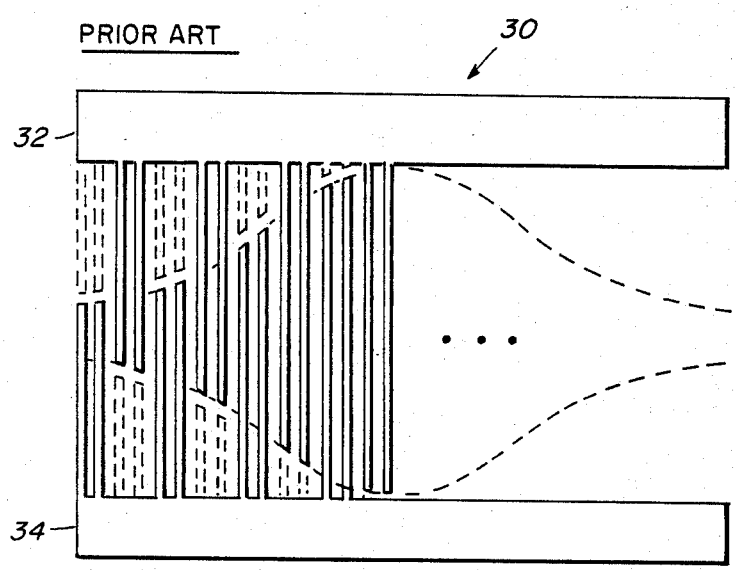
FIG. 2
AN APODIZATION WEIGHTED INTERDIGITAL TRANSDUCER
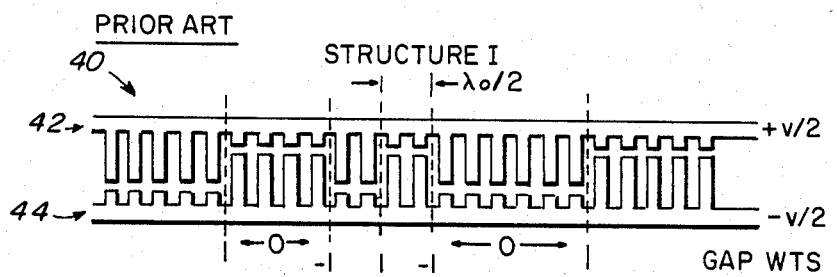
3 WEIGHTS ALLOWED: 1, 0, -1
THE NON-ZERO GAP WEIGHTS MUST ALTERNATE IN SIGN
FIG. 3 STRUCTURE I - THE STANDARD WITHDRAWAL WEIGHTED STRUCTURE
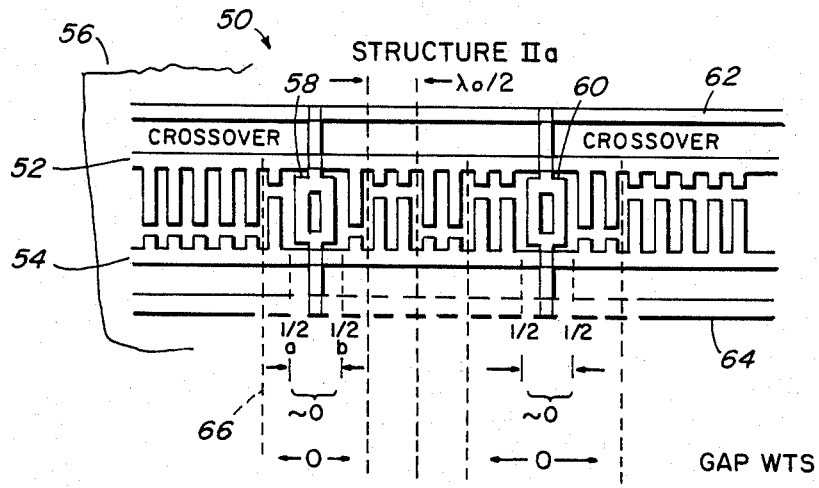
3 WEIGHTS ALLOWED: 1, 0, -1
GAPS OF THE SAME POLARITY MUST BE SEPARATED BY AT LEAST $\lambda_0$
FIG. 4 STRUCTURE IIa - A NEW WITHDRAWAL WEIGHTED STRUCTURE

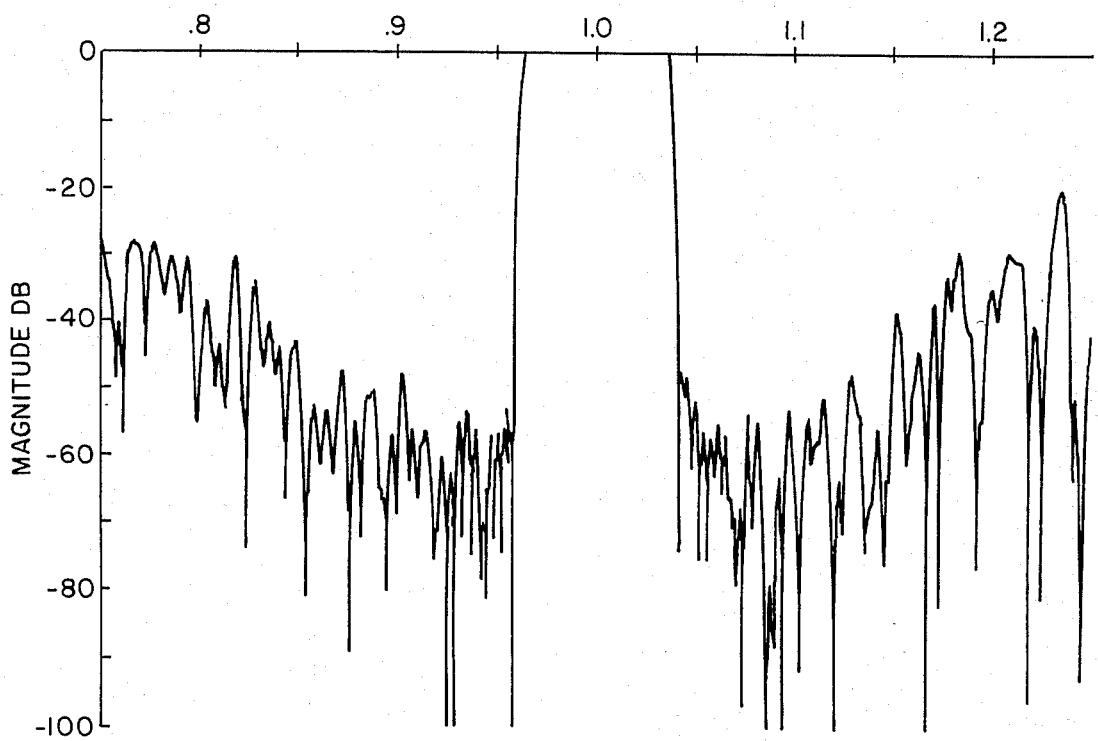
FIG. 5 FILTER FREQUENCY RESPONSE STRUCTURE-I (1,0,1 NOT ALLOWED)

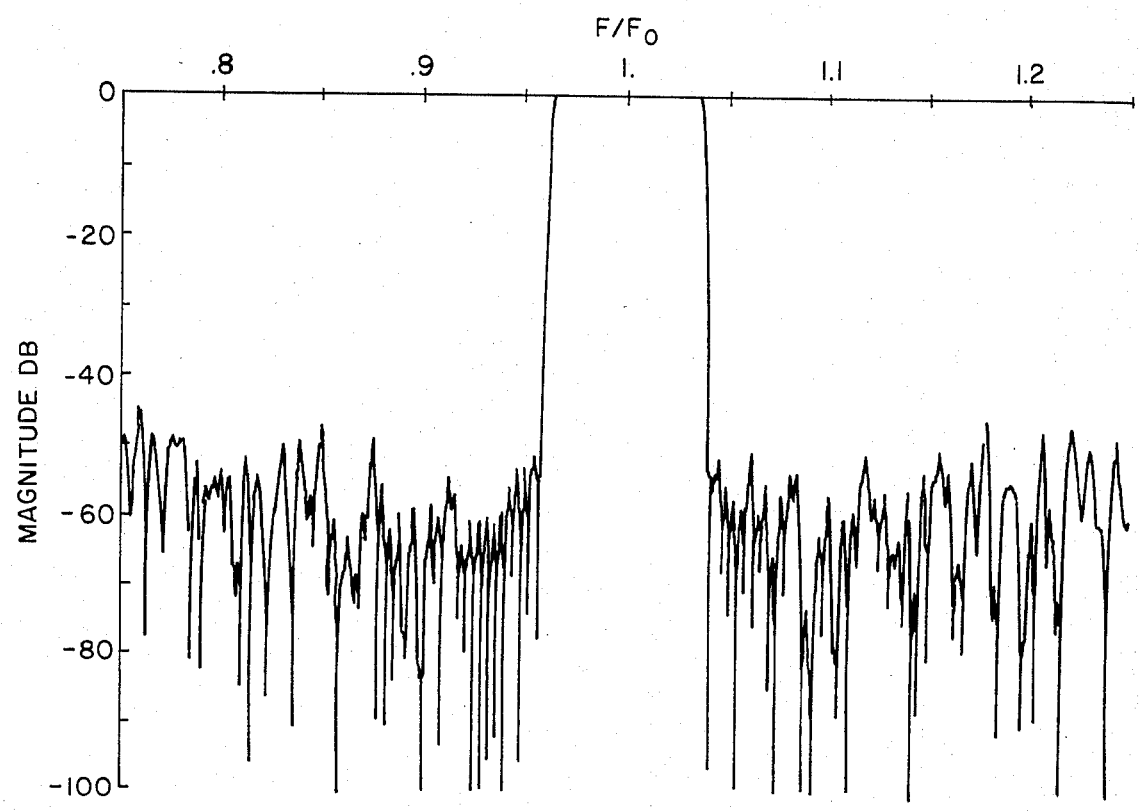
FIG. 6 FILTER FREQUENCY RESPONSE STRUCTURE-II (1, 0, 1 ALLOWED)
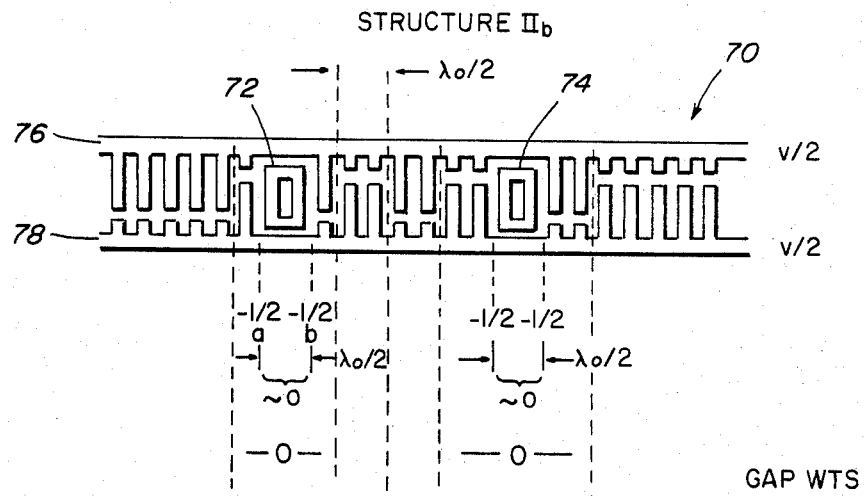
3 WEIGHTS ALLOWED: 1, 0, -1
GAPS OF THE SAME POLARITY MUST BE SEPARATED BY AT LEAST $\lambda_o$
FIG. 7 STRUCTURE II — A NEW WITHDRAWAL WEIGHTED STRUCTURE

WIDE BANDWIDTH WITHDRAWAL WEIGHTED SURFACE ACOUSTIC WAVE FILTERS

The Government has rights in this invention pursuant to Grant Number 85-8-ECS-82-11650 awarded by the National Science Foundation.

BACKGROUND OF THE INVENTION

This invention relates to band pass filters and more particularly to surface acoustic wave (SAW) filters to provide flexible electrical filtering functions in the 10 MHz to 1 GHz frequency range.

Although very good filters have been produced in the 10 MHz to 1 GHz frequency range, there is a need to increase attenuation in the rejection band and to cut the ripple in the passband, while at the same time reducing the substrate area of the SAW device to minimize cost. See, E. M. Garber and H. A. Haus (1983), "Synthesis of High Performance SAW Filters with Nonuniformly Spaced Fingers", Proceedings IEEE 1983 Ultrasonics Symposium, pp. 27-32.

SAW filters consist of two transducers, an input transducer which converts an electrical signal into an acoustic one, and an output transducer which converts it back again. Filtering is accomplished in the electro-acoustic conversion process. SAW filters utilize a piezoelectric material. The electrical signal excites surface acoustic waves via the piezoelectric effect. Physically, each transducer consists of two interdigitated metal combs deposited on a piezoelectric substrate. An example of a prior art interdigital transducer is shown in FIG. 1. A transducer element 10 includes first and second metal combs 12 and 14. The fingers 16 of the comb 12 are interdigitated with the fingers 18 of the metal comb 14. The acoustic sources of such a structure can be approximately localized to the gaps between fingers attached to opposite bus bars 20 and 22 of the combs 12 and 14. The space between acoustic sources can be simply treated as a time delay due to the dispersionless nature of SAW propagation. The impulse response of a transducer 10 roughly consists of impulses at the gaps. The time domain response of the entire filter is the convolution of the responses of the two transducers comprising the filter, or the product of their Fourier Transforms in the frequency domain. See, C. S. Hartmann, D. T. Bell, Jr., and R. C. Rosenfeld (1973), "Impulse Model Design of Acoustic Surface Wave Filters", IEEE Trans. on Sonics and Ultrasonics, SU-20, pp. 80-93.

At the present time, high performance frequency responses typically require apodized impulse responses. Apodized impulse responses are implemented by varying the overlap between fingers attached to opposite bus bars of a comb structure. Such a prior art transducer element is shown in FIG. 2. In this case, a transducer 30 includes comb structures 32 and 34 whose fingers overlap by varying amounts. The problem with the transducer element 30 is that diffraction and transverse electrostatic end effects from the many small overlaps typically required for high performance filters severely degrade the frequency response and are difficult to compensate for in practice. See, W. R. Mader, C. Ruppel and E. Ehrman-Falkenau (1982), "Universal Method for Compensation of SAW Diffraction and Other Second Order Effects", Proceedings IEEE 1982 Ultrasonics Symposium, pp. 23-28 and R. S. Wagers (1976), "Transverse Electrostatic End Effects in Interdigital Transducers", Proceedings IEEE 1976 Ultrasonics Symposium, pp. 536-539.

Withdrawal weighting was introduced to avoid the above-mentioned problem with apodization. See, C. S. Hartmann (1973), "Weighting Interdigital Surface Wave Transducers by Selective Withdrawal of Electrodes", Proceedings IEEE 1973 Ultrasonics Symposium, pp. 423-426. In this technique, a prototype amplitude modulated waveform is approximated by a sequence of constant amplitude samples and some zero weight ones. Since the aperture is uniform, diffraction and electrostatic end effects are much less significant, and the maximum aperture may even be reduced to save substrate area and thereby cut costs. Generally speaking, the aperture is the distance between the bus bars. The withdrawal weighting technique is based on the fact that in a narrow band sense, acoustic source weights can be moved by half a wavelength and reversed in sign, without affecting the frequency response significantly. The currently known withdrawal weighted configuration is shown in FIG. 3 and is referred to as Sturcture I. A withdrawal weighted transducer 40 includes comb structures 42 and 44 having fingers which create gaps having either 1, 0, or −1 weights as shown in the figure. With a structure such as 40, it is a geometrical necessity that the non-zero gap weights alternate in sign. This is a rather strong restriction. For example, the non-implementable sequence of weights 1,0,1,0 would represent in a withdrawal weighting sense the frequently needed sequence of half strength samples, $\frac{1}{2}, -\frac{1}{2}, \frac{1}{2}, -\frac{1}{2}$. Using the structure 40, such a sequence would have to be represented as −1,1,0, 0,−1,1,0,0 which is clearly a worse approximation since averaging must be done over four samples instead of only two to see that half weight samples are being approximated.

It is therefore an object of this invention to provide a surface acoustic wave transducer element which overcomes the problems of both apodized and standard withdrawal weighted filter structures.

It is a further object of the invention to provide such a transducer element which facilitates the design of sharp cut-off filters with low pass band ripple and low sidelobes over a broad frequency range.

Another object of the invention is a transducer element which is fabricated by standard integrated circuit fabrication techniques.

SUMMARY OF THE INVENTION

These and other objects of the invention are achieved in a transducer structure including a piezoelectric layer or substrate onto which are placed interdigitated conducting structures. A spacer element is disposed between every pair of gaps in the structure having the same polarity. This replaces the undesired extra gap between gaps of the same polarity with two half-weight gaps which cancel over a broad frequency range. In this way, sequence of successive gaps of the same sign can be implemented.

BRIEF DESCRIPTION OF THE DRAWING

The invention disclosed herein will be understood better with reference to the drawing of which FIG. 1 is a prior art interdigital transducer;

FIG. 2 is a prior art overlap weighted interdigital transducer;

FIG. 3 is a prior art withdrawal weighted transducer;

FIG. 4 is a plan view of a withdrawal weighted structure disclosed herein including grounded spacer elements;

FIG. 5 is a graph of the filter frequency response of a prior art withdrawal weighted filter;

FIG. 6 is a graph of filter frequency response for the structures disclosed herein; and FIG. 7 is a plan view of another embodiment of the present invention.

DESCRIPTION OF THE PREFERRED EMBODIMENT

With reference first to FIG. 4, a transducer 50 (referred to as Sturcture IIa) includes a first comb structure 52 and a second comb structure 54 mounted on a piezoelectric substrate 56. The combs must be driven from a balanced electrical source that is symmetrical with respect to the grounded spacers 58 and 60 described below. Substrate 56 can be lithium niobate, lithium tantalate, zinc oxide, quartz, gallium arsenide or any other piezoelectric material or film. Lithium niobate is the preferred material for Structure IIa while a weakly piezoelectric substrate such as quartz is the preferred substrate for Structure IIb of FIG. 7 as will be explained later. The comb structures 52 and 54 and the spacers 58, 60 and the grounded bus bars 62, 64 can be made of any metal, but copper doped aluminum is especially suitable due to its high conductivity, low susceptibility to metal migration problems and its good acoustic match to materials such as quartz. Transducer structure 50 includes spacer elements 58 and 60 which are grounded by means of electrical connection to bus bars 62 and 64. The spacer elements must be electrically insulated from the structures 52 and 54 at the crossover locations.

In most cases the entire structure including the crossovers can be fabricated using the same standard techniques that are used for integrated circuits. The crossovers need not have especially low capacitance unless it is important to maximize the bandwidth over which the insertion loss is low. In this case it is only necessary to ensure that half the capacitance between bus bar 52 and ground is small compared to the total capacitance between bus bars 52 and 54. A similar statement applies to the capacitance between bus bar 54 and ground. The spacer element 58 which is a pair of shorted fingers is disposed between gaps having a +1 polarity as shown by the dotted lines 66 and 68. The introduction of the spacer element 58 yields half weight gaps of the same sign separated by half a wavelength at the points labeled a and b in FIG. 4. In this case each of these gaps has a half weight of $-\frac{1}{2}$. Because of this arrangement, transduction at these points will cancel over a broad bandwidth about the center frequency allowing sequences with successive gaps of the same sign (such as 1,0,1,0) to be implemented. The only remaining restriction is that there must be at least one full wavelength between gaps of the same sign. This restriction is not really a significant problem since if the spacing between the gaps were only half a wavelength there would be essentially no transduction from the pair.

The improved performance realizable with the structure 50 of FIG. 4 is demonstrated with reference to FIGS. 5 and 6 and Table I below. FIG. 5 is the filter frequency response from a prior art withdrawal weighted structure in which successive non-zero gaps cannot have the same polarity. FIG. 6 shows the filter frequency response using the novel structure of FIG. 4.

The filters in both FIGS. 5 and 6 are withdrawal weighted versions of the same amplitude and phase modulated prototype waveform. Note that the added design freedom provided by the structure in FIG. 4 (Structure IIa) yields controlled sidelobes over a 60% broader bandwidth than in FIG. 5, and in addition, cuts the passband ripple by more than a factor of 2.

TABLE I

Performance of the Withdrawal Weighted Structures

| | Peak Inner Sidelobe (dB) | Peak-Peak Passband Ripple (dB) | Fractional Bandwidth of Controlled Sidelobes (−40 dB) |
|---|---|---|---|
| Structure I | −47.5 | .86 | 34% |
| Structure II | −50.8 | .37 | 55% |

Note:
Both the filters are 252 wavelengths long, have a 7.1% fractional bandwidth and a reject level to passband level shape factor of 1.15.

FIG. 7 is another embodiment (Structure IIb) of the invention disclosed herein. A transducer element 70 is similar to the element 50 of FIG. 4 except that spacer elements 72 and 74 between gaps of the same polarity are now electrically floating, making it much easier to fabricate. This is the case in that the insulated crossover of FIG. 4 is eliminated. In addition, a balanced electrical drive is no longer necessary. These spacers 72 and 74 will float to a potential halfway between that of the two bus bars, 76 and 78, due to the antisymmetry of the structure about each spacer. Thus, on transduction, the structures of FIGS. 4 and 7 will behave similarly. The floating spacers 72 and 74 will in general reflect at the center frequency, although this is only a minor problem on weakly piezoelectric substrate such as quartz and gallium arsenide. In addition, it may be possible to eliminate this source of reflection by proper choice of the metalization ratio and the material thickness to cancel the reflection of mechanical origin with the piezoelectrically generated one.

It is thus seen that the objects of this invention have been achieved in that there has been disclosed transducer elements for electro-acoustic filters which have added flexibility over prior art structures. This added flexibility results in less ripple in the passband and a broader bandwidth rejection region.

It is recognized that modifications and variations will occur to those skilled in the art and it is intended that all such modifications and variations be included within the scope of the appended claims.

What is claimed is:

1. Transducer element for use in broadband surface acoustic wave filter comprising:
   a piezoelectric substrate;
   a pair of withdrawal weighted conductive comb structures having interdigitated fingers; and further including at least one spacer element means disposed within said comb structure, said spacer element means adapted to produce half weight gaps.

2. The transducer element of claim 1 wherein said spacer element is electrically grounded.

3. The transducer element of claim 1 wherein said spacer element is electrically floating.

4. The transducer of claim 1 wherein the half weight gaps are separated by half a wavelength.

5. The transducer element of claim 1 wherein the comb structure is adapted to have gaps of positive and negative polarity wherein the gaps of the same polarity are separated by at least one wavelength.

6. The transducer element of claim 1 wherein said piezoelectric substrate is lithium niobate.

7. The transducer element of claim 1 wherein said piezoelectric substrate is quartz.

8. The transducer element of claim 1 wherein said comb structure is copper doped aluminum.

9. The transducer element of claim 1 wherein said comb structure includes a pair of bus bars with depending fingers.

10. The transducer element of claim 1 wherein said spacer element comprises a pair of shorted fingers of said comb structure.

* * * * *